(12) United States Patent
Hu

(10) Patent No.: US 12,004,398 B2
(45) Date of Patent: Jun. 4, 2024

(54) DISPLAY PANEL AND MANUFACTURING METHOD THEREOF

(71) Applicant: Wuhan China Star Optoelectronics Semiconductor Display Technology Co., Ltd., Wuhan (CN)

(72) Inventor: Junyan Hu, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 768 days.

(21) Appl. No.: 16/957,114

(22) PCT Filed: Apr. 21, 2020

(86) PCT No.: PCT/CN2020/085792
§ 371 (c)(1),
(2) Date: Jun. 23, 2020

(87) PCT Pub. No.: WO2021/203469
PCT Pub. Date: Oct. 14, 2021

(65) Prior Publication Data
US 2023/0107421 A1 Apr. 6, 2023

(30) Foreign Application Priority Data
Apr. 8, 2020 (CN) .......................... 202010268076.8

(51) Int. Cl.
*H10K 59/131* (2023.01)
*H10K 59/12* (2023.01)

(52) U.S. Cl.
CPC ..... *H10K 59/1315* (2023.02); *H10K 59/1201* (2023.02)

(58) Field of Classification Search
CPC ....................... H10K 59/1315; H10K 59/1201
USPC ........................................................ 257/40
See application file for complete search history.

(56) References Cited

U.S. PATENT DOCUMENTS

| 2021/0159281 | A1* | 5/2021 | Kim ....................... H10K 50/11 |
| 2021/0367020 | A1* | 11/2021 | Bok ..................... H10K 59/126 |
| 2022/0165827 | A1* | 5/2022 | Xu ..................... H10K 59/1201 |

FOREIGN PATENT DOCUMENTS

| CN | 108807426 | 11/2018 |
| CN | 108878455 | 11/2018 |
| CN | 108919581 | 11/2018 |
| CN | 109119447 | 1/2019 |

(Continued)

*Primary Examiner* — Xia L Cross
(74) *Attorney, Agent, or Firm* — PV IP PC; Wei Te Chung; Zhigang Ma

(57) ABSTRACT

A display panel and a manufacturing method include a substrate divided into a transparent region, a wiring changing region, and a display region; a first signal conducting wire including a first line segment and a second line segment and disposed on a plurality of insulating layers; and a planarization layer disposed on the first line segment, the second line segment, and the plurality of insulating layers. The first signal conducting wire further includes a first anode wiring disposed on the planarization layer, is located in the wiring changing region, and is electrically connected to the first line segment and the second line segment. Using signal conducting wires and wirings of the anode wirings reduces manufacturing of a layer of the signal conducting wires and a layer of the planarization layer above.

20 Claims, 8 Drawing Sheets

(56) References Cited

FOREIGN PATENT DOCUMENTS

| | | |
|---|---|---|
| CN | 109270759 | 1/2019 |
| CN | 10-9638064 | 4/2019 |
| CN | 109585519 | 4/2019 |
| CN | 109767689 | 5/2019 |
| CN | 110429107 | 11/2019 |
| CN | 110429116 | 11/2019 |
| CN | 110780501 | 2/2020 |
| CN | 107634072 | 4/2020 |
| KR | 101740192 | 5/2017 |

* cited by examiner

DISPLAY PANEL AND MANUFACTURING METHOD THEREOF

RELATED APPLICATIONS

This application is a National Phase of PCT Patent Application No. PCT/CN2020/085792 having International filing date of Apr. 21, 2020, which claims the benefit of priority of Chinese Patent Application No. 202010268076.8 filed on Apr. 8, 2020. The contents of the above applications are all incorporated by reference as if fully set forth herein in their entirety.

FIELD AND BACKGROUND OF THE INVENTION

The present disclosure relates to the field of display technology, and particularly relates to an organic light emitting diode (OLED) display panel and a manufacturing method thereof.

Organic light emitting diodes (OLEDs) have good self-illumination characteristics, high contrast, and low electric power consumption, and are currently an important research and development trend of display devices, and have achieved significant results in aspects such as small dimension and large dimension screens, etc. On the other hand, because the development trend of displays have gradually shifted towards aspects such as curved surfaces, bendability, narrow bezels, etc., high screen-to-body ratio has become an important point of focus on aspects such as mobile phones, tablets, displays, televisions, etc., which maximizes utilization of the display areas of screens, thereby attaining a full-screen effect to bring a better visual experience for users. However, a camera wiring changing region disposed on a display panel of a mobile phone in the prior art is large, reducing an area of a display region and lowering the screen-to-body ratio. Moreover, there are many layers on the wiring changing region, so more steps are needed during manufacturing, increasing manufacturing cost and processing risk.

SUMMARY OF THE INVENTION

A purpose of the present disclosure is to solve a technical problem that a camera wiring changing region disposed on a display panel of a mobile phone in the prior art is large, reducing an area of a display region and lowering the screen-to-body ratio, and there are layers on the wiring changing region, so more steps are needed during manufacturing, increasing manufacturing cost and processing risk.

In order to solve the technical problem mentioned above, one purpose of the present disclosure is to provide a display panel and a manufacturing method thereof, which can reduce an area of a wiring changing region and can decrease a layer number of the wiring changing region, thereby increasing a screen-to-body ratio and can reduce manufacturing cost and processing risk.

In order to reach the purpose mentioned above, the present disclosure provides a display panel. The display panel includes:
  a substrate divided into a transparent region, a wiring changing region, and a display region, wherein the wiring changing region encircles the transparent region, the display region encircles the wiring changing region, and the display region has a first position and a second position;
  an active layer disposed on the substrate;
  a plurality of insulating layers disposed on the active layer;
  a first signal conducting wire comprising:
    a first line segment disposed on the plurality of insulating layers and extending to the wiring changing region from the first position of the display region;
    a second line segment disposed on the plurality of insulating layers and extending to the second position of the display region from the wiring changing region; and
    a planarization layer disposed on the first line segment, the second line segment, and the plurality of insulating layers;
    wherein the first signal conducting wire comprises a first anode wiring disposed on the planarization layer and located in the wiring changing region, and the first anode wiring is electrically connected to the first line segment and the second line segment.

In an embodiment of the present disclosure, a line width of the first line segment, a line width of the second line segment, and a line width of the first anode wiring are less than or equal to 5 um.

In an embodiment of the present disclosure, the display panel further includes a second signal conducting wire disposed on a side of the first signal conducting wire, wherein the second signal conducting wire is disposed on the plurality of insulating layers, extends to the second position of the display region from the first position of the display region, and passes through the wiring changing region.

In an embodiment of the present disclosure, the first anode wiring and the second signal conducting wire are arranged in an up-and-down staggered arrangement.

In an embodiment of the present disclosure, the first signal conducting wire and the first anode wiring are arranged in an up-and-down staggered arrangement.

In an embodiment of the present disclosure, the display panel further includes a plurality of first anode wirings and a plurality of second signal conducting wires, wherein at least two of the plurality of second signal conducting wires are disposed between two adjacent first anode wirings.

In an embodiment of the present disclosure, the display panel further includes a plurality of first anode wirings and a plurality of second signal conducting wires, wherein at least two of the plurality of first anode wirings are disposed between two adjacent second signal conducting wires.

In an embodiment of the present disclosure, an interval between a projection of the first signal conducting wire on the substrate and a projection of the second signal conducting wire on the substrate is greater than or equal to 0 um.

In an embodiment of the present disclosure, the display panel further includes a second signal conducting wire located on a side of the first signal conducting wire. The second signal conducting wire includes:
  a third line segment disposed on the plurality of insulating layers and extending to the wiring changing region from the first position of the display region;
  a fourth line segment disposed on the plurality of insulating layers and extending to the second position of the display region from the wiring changing region; and
  a second anode wiring disposed on the planarization layer and located in the wiring changing region, wherein the second anode wiring is electrically connected to the third line segment and the fourth line segment;
  wherein the first line segment has a first sub-line segment and a second sub-line segment, the first sub-line segment is disposed in the display region and the wiring changing region, and the second sub-line segment is disposed in the wiring changing region and is connected to the first sub-line segment and the first anode wiring; and wherein the fourth line segment has a third sub-line segment and a fourth sub-line segment, the third sub-line segment is disposed in the display region and the wiring changing region, and the fourth sub-line segment is disposed in the wiring changing region and is connected to the third sub-line segment and the second anode wiring.

In an embodiment of the present disclosure, a position of the second sub-line segment corresponds to a position of the second anode wiring, and a position of the first anode wiring corresponds to a position of the fourth sub-line segment.

In an embodiment of the present disclosure, a line width of the first line segment, a line width of the second line segment, and a line width of the first anode wiring are less than or equal to 5 um, and an interval between a projection of the first signal conducting wire on the substrate and a projection of the second signal conducting wire on the substrate is greater than or equal to 0 um.

The present disclosure further provides a manufacturing method of a display panel, includes following steps:

providing a substrate, wherein the substrate is divided into a transparent region, a wiring changing region, and a display region, wherein the wiring changing region encircles the transparent region, the display region encircles the wiring changing region, and the display region have a first position and a second position;

forming an active layer and a first insulation layer on the substrate;

forming a plurality of metal conducting wires and a plurality of insulating layers on the first insulation layer;

forming a first line segment and a second line segment of a first signal conducting wire on the plurality of insulating layers, wherein the first line segment extends to the wiring changing region from the first position of the display region, the second line segment extends to the second position of the display region from the wiring changing region, and forming a planarization layer on the first line segment, the second line segment, and the plurality of insulating layers; and forming a first anode wiring of the first signal conducting wire on the planarization layer and in the wiring changing region, wherein the first anode wiring is electrically connected to the first line segment and the second line segment.

In an embodiment of the present disclosure, the substrate has a first base, a first barrier layer, a second base, a second barrier layer, and a buffer layer.

In an embodiment of the present disclosure, the transparent region has a concave section.

In an embodiment of the present disclosure, the first base and the second base are formed from polyimide, and the buffer layer is formed from silicon nitride or silica based material.

In an embodiment of the present disclosure, the active layer is formed from low-temperature polycrystalline-silicon, and the first insulation layer is formed from silicon nitride or silica based material.

In an embodiment of the present disclosure, forming the plurality of metal conducting wires and the plurality of insulating layers on the first insulation layer includes:

forming a plurality of gate electrodes, a second insulation layer, a third insulation layer, and a fourth insulation layer on the first insulation layer of the display region.

In an embodiment of the present disclosure, the plurality of gate electrodes are formed from molybdenum.

In an embodiment of the present disclosure, forming the plurality of metal conducting wires and the plurality of insulating layers on the first insulation layer includes:

forming a first metal conducting wire, a second insulation layer, a second metal conducting wire, a third insulation layer, and a fourth insulation layer on the first insulation layer of the wiring changing region.

In an embodiment of the present disclosure, the first metal conducting wire and the second metal conducting wire are formed from molybdenum, and the second insulation layer, the third insulation layer, and the fourth insulation layer are formed from silicon nitride or silica based material.

In an embodiment of the present disclosure, forming the first line segment and the second line segment of the first signal conducting wire on the plurality of insulating layers, and forming the planarization layer on the first line segment, the second line segment, and the plurality of insulating layers include:

defining a plurality of electrically conductive holes in the first insulation layer, the second insulation layer, the third insulation layer, and the fourth insulation layer of the display region, and then forming a source electrode and a drain electrode on the fourth insulation layer.

In summary, the present disclosure provides a display panel and a manufacturing method thereof. The anode layer located on the display region and the first anode wiring located on the wiring changing region are formed simultaneously, and changing wirings of the first line segment, the second line segment, and the first anode wiring of the first signal conducting wire are used on the wiring changing region to replace changing wirings between signal conducting wires at up-and-down two layers in the prior art, reducing manufacturing of a layer of a signal conducting wire and a layer of a planarization layer above, and can reduce a manufacturing process time, thereby reducing manufacturing cost and processing risk. In addition, the first metal conducting wire and the second metal conducting wire of the wiring changing region are located on layers with different heights to form a wiring structure with an up-and-down staggered arrangement, and the first anode wiring of the first signal conducting wire and the second signal conducting wire of the wiring changing region are located on layers with different heights to form a wiring structure with an up-and-down staggered arrangement. Compared to panels in the prior art, that is, a manner of disposing all scanning lines and data lines at a same layer respectively, the present disclosure greatly improves wiring density, thereby reducing an area of the wiring changing region, improving an area of the display region, and improving screen-to-body ratio.

Technical effect of the present disclosure is a manner of disposing all scanning lines and data lines on different layers respectively, improving wiring density greatly, thereby reducing an area of the wiring changing region, improving an area of the display region, and improving screen-to-body ratio.

DESCRIPTION OF SPECIFIC EMBODIMENTS OF THE INVENTION

The preferred embodiments of the present disclosure are described in detail below with reference to the accompanying figures to completely introduce technical content of the present disclosure to those skilled in the art, and to give an example that the present disclosure can be implemented. This makes the technical content of the present disclosure will be clearer and those skilled in the art will more readily understand how to implement the present disclosure. However, the present disclosure can be implemented in many different forms of embodiments. The scope of the present disclosure is not limited to the embodiments mentioned herein, and the description of the embodiments below is not intended to limit the scope of the present disclosure.

The directional terms of which the present disclosure mentions, for example, "top," "bottom," "upper," "lower," "front," "rear," "left," "right," "inside," "outside," "side," etc., are just refer to directions of the accompanying figures. The directional terms used herein are used to explain and describe the present disclosure, and are not intended to limit the scope of the present disclosure.

In the accompanying figures, elements with same structures are used same labels to indicate, and components that have similar structure or function are denoted by similar labels.

A first embodiment of the present disclosure provides a manufacturing method of an organic light emitting diode (OLED) display panel. Please refer to FIG. 1 to FIG. 8, the manufacturing method includes following steps:

S1: providing a substrate.

Figure 1:
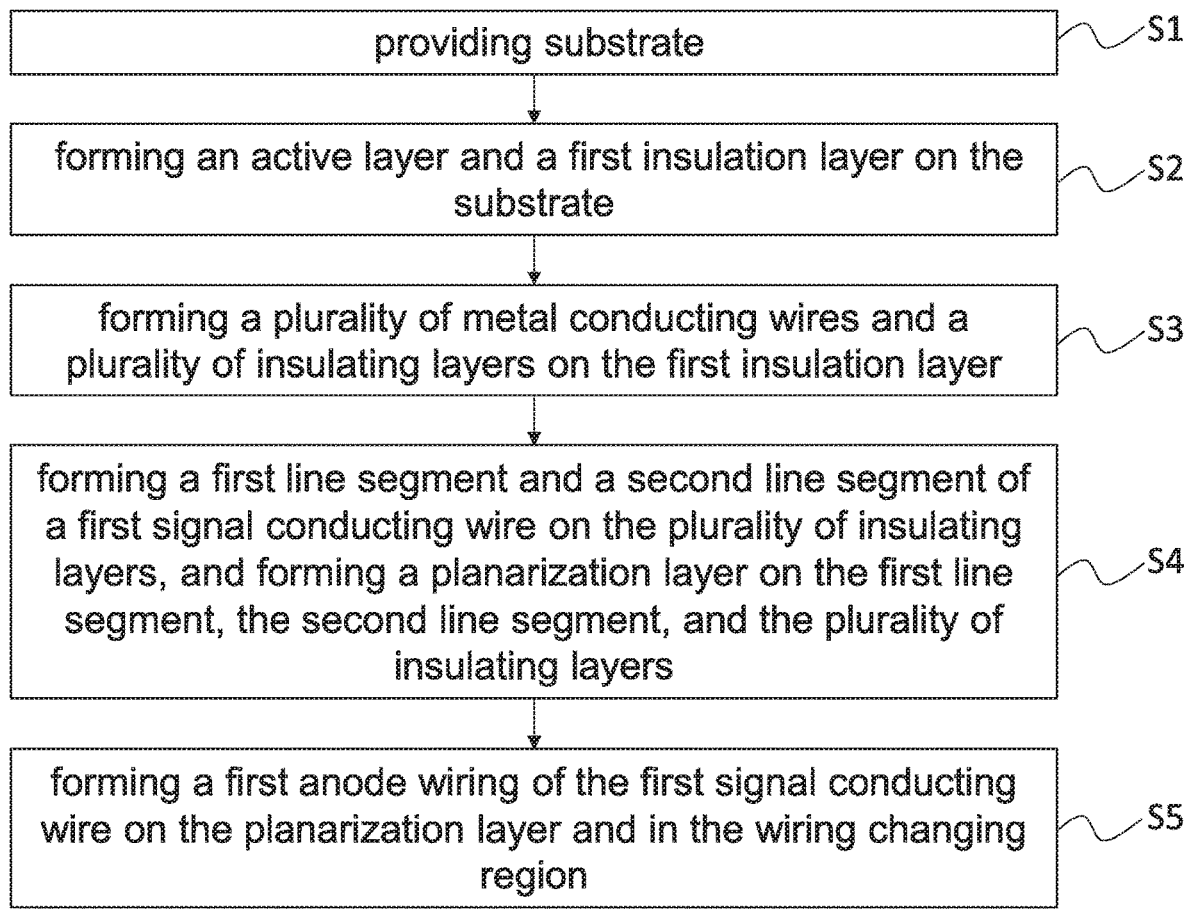
FIG. 1 is a flowchart of a manufacturing method of a display panel of a first embodiment of the present disclosure.
Figure 2:
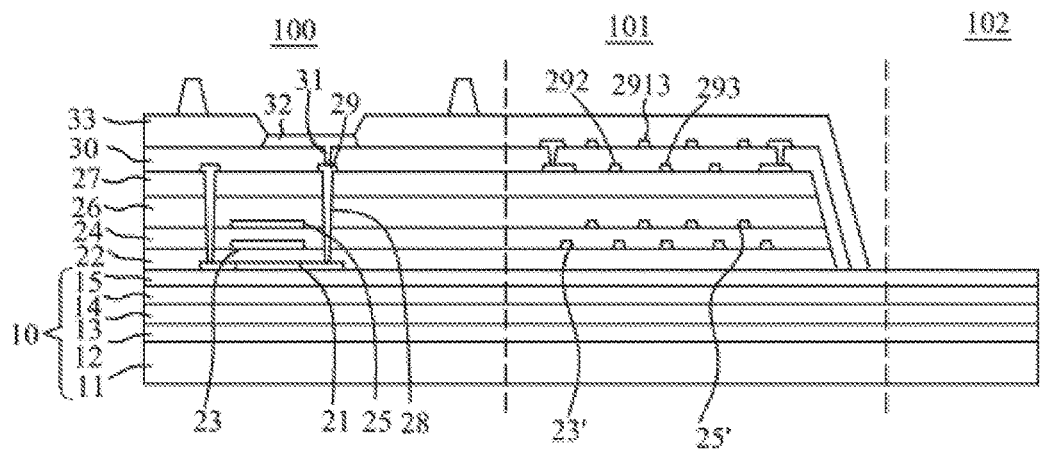
FIG. 2 is a structural schematic diagram of the display panel of the first embodiment of the present disclosure.
Figure 3:
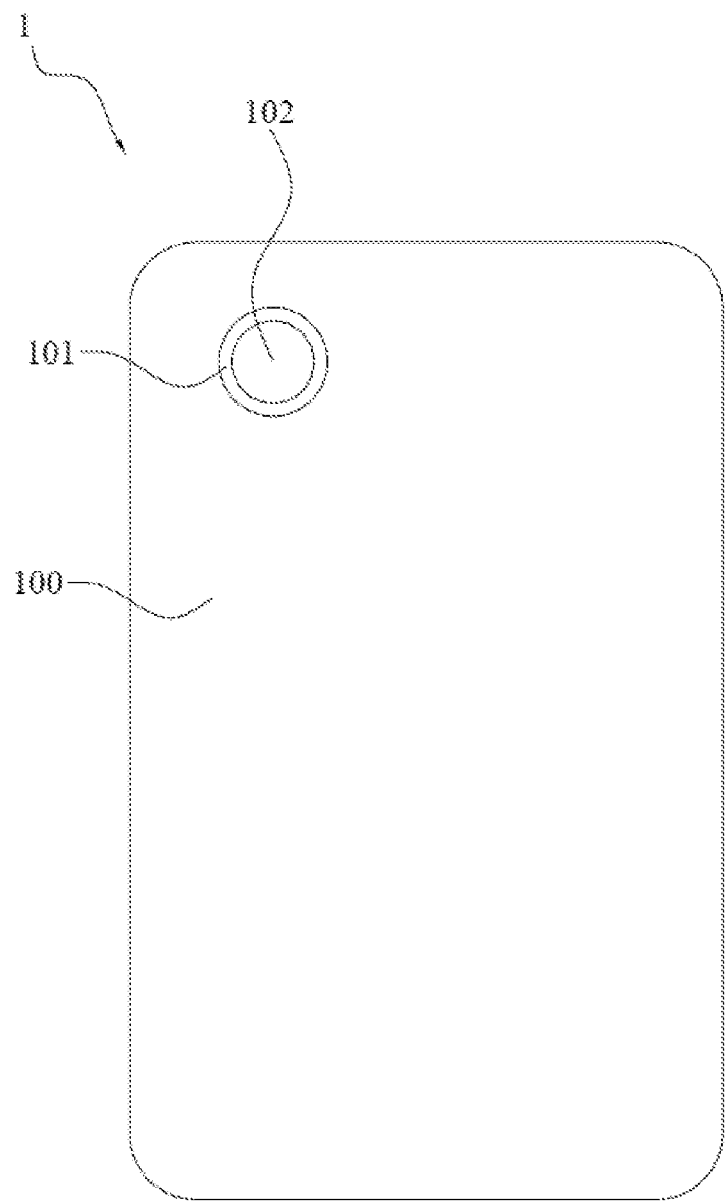
FIG. 3 is a top view of the display panel of the first embodiment of the present disclosure.

As illustrated in FIG. 1 and FIG. 2, a substrate 10 is provided. The substrate 10 has a first base 11, a first barrier layer 12, second base 13, a second barrier layer 14, and a barrier layer 15, and the substrate 10 is divided into a display region 100, a wiring changing region 101, and a transparent region 102. Furthermore, as illustrated in FIG. 3, the wiring changing region 101 encircles the transparent region 102, and the display region 100 encircles the wiring changing region 101.

The transparent region 102 has a concave section. A shape and a size of the concave section is manufactured to match a shape and a size of a device to-be-installed. For example, the device can be a front camera of a mobile phone, a distance sensor, a photoreception component, etc.

Furthermore, the first base 11 and the second base 13 are formed from a flexible transparent material such as polyimide, etc, and the buffer layer 15 is formed from silicon nitride or silica based material.

S2: forming an active layer and a first insulation layer on the substrate.

Specifically, as illustrated in FIG. 2, an active layer 21 and a first insulation layer 22 are formed on the buffer layer 15 of display region 100 and the wiring changing region 101. The active layer 21 is formed from low-temperature polycrystalline-silicon, and the first insulation layer 22 is formed from silicon nitride or silica based material.

S3: forming a plurality of metal conducting wires and a plurality of insulating layers on the first insulation layer.

Specifically, a gate electrode 23, a second insulation layer 24, a gate electrode 25, a third insulation layer 26, and a fourth insulation layer 27 are formed on the first insulation layer 22 of the display region 100, and a first metal conducting wire 23', a second insulation layer 24, a second metal conducting wire 25', a third insulation layer 26, and a fourth insulation layer 27 are formed on the first insulation layer 22 of the wiring changing region 101.

The gate electrode 23, the first metal conducting wire 23', and the second metal conducting wire 25' are formed from molybdenum (Mo) as an example, and the second insulation layer 24, the third insulation layer 26, and the fourth insulation layer 27 are formed from silicon nitride or silica based material.

In this embodiment, the first metal conducting wire 23' and the second metal conducting wire 25' of the wiring changing region 101 are scanning lines. Furthermore, the first metal conducting wire 23' and the second metal conducting wire 25' of the wiring changing region 101 are located on layers with different heights to form a wiring structure with an up-and-down staggered arrangement. Compared to a method of disposing all scanning lines on a same layer in a panel of the prior art, the present disclosure improves wiring density, thereby reducing an area of the wiring changing region.

In addition, the plurality of metal conducting wires of this embodiment include the first metal conducting wire 23' and the second metal conducting wire 25', and the plurality of insulating layers include a second insulation layer 24, a third insulation layer 26, and a fourth insulation layer 27. In other embodiment, the plurality of metal conducting wires and the plurality of insulating layers can include different numbers of metal conducting wires and insulating layers, and it is not limited thereto.

S4: forming a first line segment and a second line segment of a first signal conducting wire on the plurality of insulating layers, and forming a planarization layer on the first line segment, the second line segment, and the plurality of insulating layers.

Figure 4:
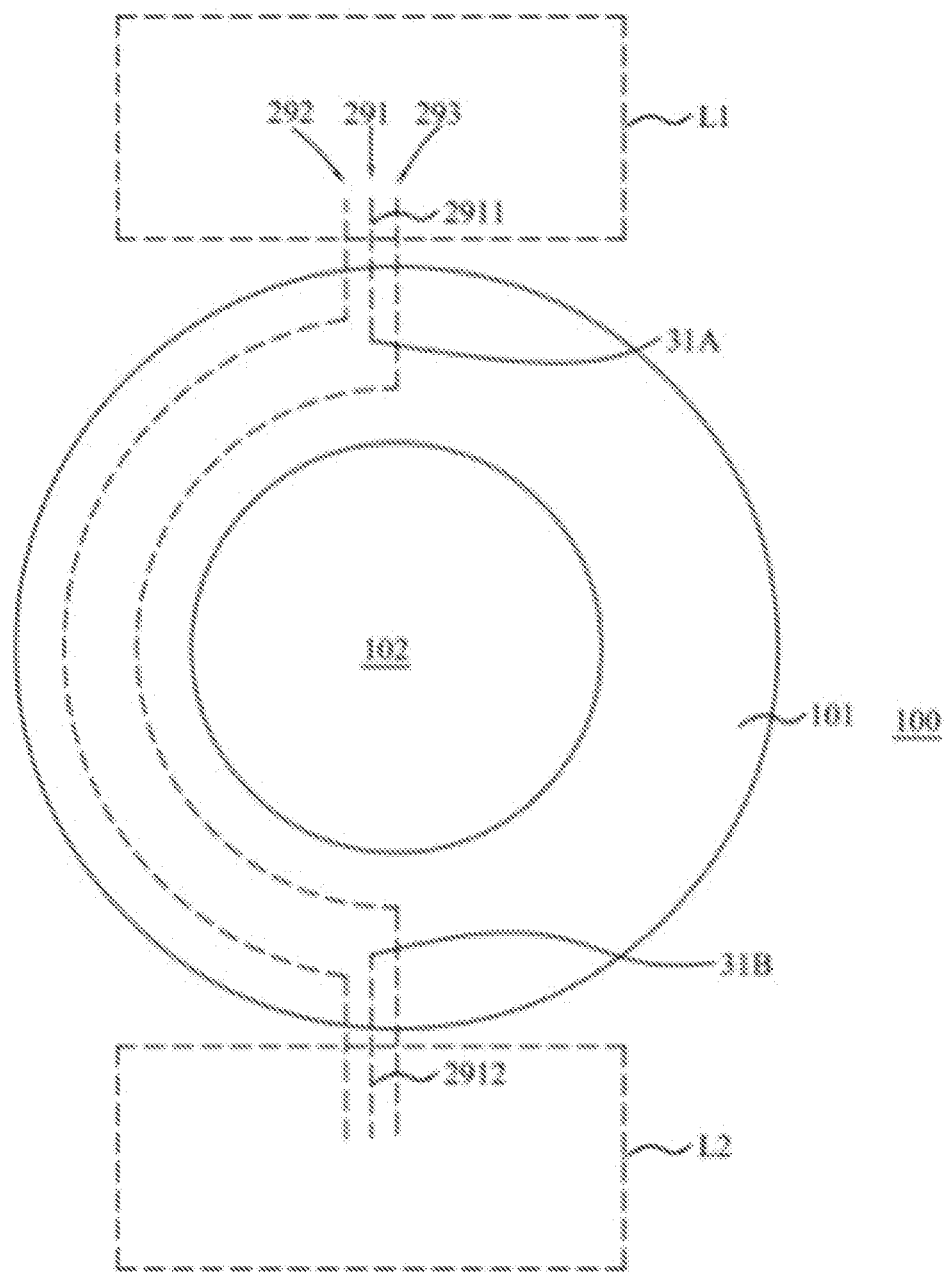
FIG. 4 is a top view after a planarization layer and electrically conductive holes being formed in the first embodiment of the present disclosure.

Specifically, as illustrated in FIG. 2, a plurality of electrically conductive holes 24 are defined in the first insulation layer 22, the second insulation layer 24, the third insulation layer 26, and the fourth insulation layer 27 of the display region 100, and then a source electrode/drain electrode 29 is formed on the fourth insulation layer 27, thereby making the source electrode/drain electrode 29 electrically connect to the active layer 21 through the electrically conductive holes 28. On the other hand, please refer to FIG. 4, FIG. 4 is a top view of this embodiment. When the source electrode/drain electrode 29 is formed, the first line segment 2911 and the second line segment 2912 of a first signal conducting wire 291 are formed on the fourth insulation layer 27. Furthermore, the first line segment 2911 extends to the wiring changing region 101 from the first position L1 of the display region 100, the second line segment 2912 extends to the second position L2 of the display region 100 from the wiring changing region 101, and the source electrode/drain electrode 29 and the first line segment 2911 and the second line segment 2912 of the first signal conducting wire 291 are located at a same horizontal height.

In this embodiment, when the first line segment 2911 and the second line segment 2912 are formed, the second signal conducting wire 292 and the third signal conducting wire 293 are simultaneously formed on the fourth insulation layer 27. The second signal conducting wire 292 is located on a side of the first signal conducting wire 291. The third signal conducting wire 293 is located on another side of the first signal conducting wire 291. The second signal conducting wire 292 and the third signal conducting wire 293 extend to the second position L2 of the display region 100 from the first position L1 of the display region 100 and passes through the wiring changing region 101.

Afterwards, as illustrated in FIG. 2, the planarization layer 30 is formed on the source electrode/drain electrode 29, the first line segment 2911 (not shown in FIG. 2), the second line segment 2912 (not shown in FIG. 2), the second signal conducting wire 292, the third signal conducting wire 293, and the fourth insulation layer 27.

The source electrode/drain electrode 29, the first line segment 2911, the second line segment 2912, the second signal conducting wire 292, and the third signal conducting wire 293 are formed from titanium (Ti), aluminum (Al), or a laminated layer of the two, and the planarization layer is formed from a transparent organic material.

S5: forming a first anode wiring of the first signal conducting wire on the planarization layer and in the wiring changing region.

Figure 5:
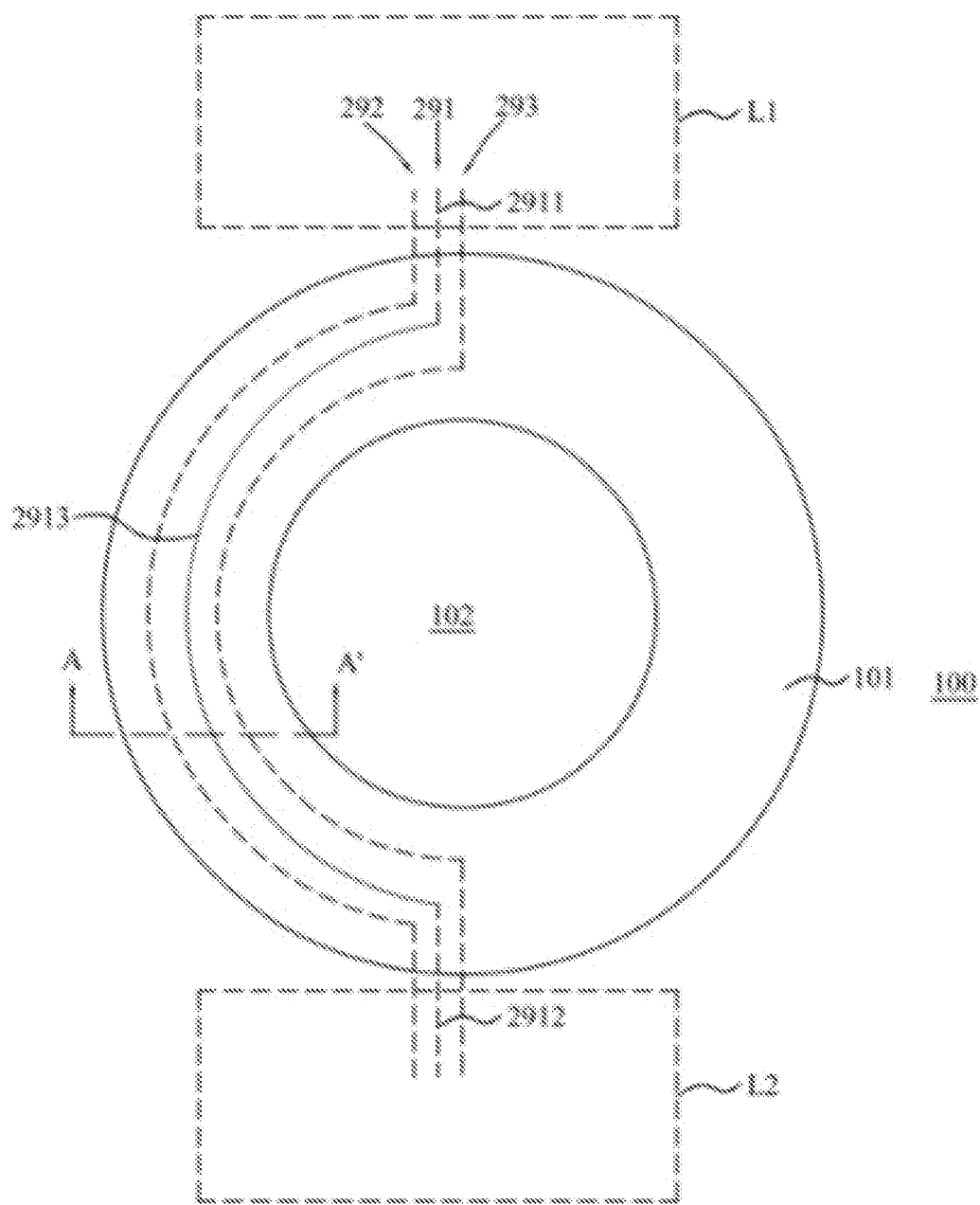
FIG. 5 is a top view after anode wirings being formed in the first embodiment of the present disclosure.

Specifically, an electrically conductive hole 31 is formed in the planarization layer 30 of the display region 100. As illustrated in FIG. 2, afterwards, an anode layer 32 is formed on the planarization layer 30, thereby making the anode layer 32 electrically connect to the first signal conducting wire 29 by the electrically conductive hole 31, and then an organic layer 33 is formed on the planarization layer 30 and part of the anode layer 32. On the other hand, electrically conductive holes are defined in the planarization layer of the wiring changing region 101. Please refer to FIG. 4, an electrically conductive hole 31A and an electrically conductive hole 31B are formed in the planarization layer 30, and then the first anode wiring 2913 of the first signal conducting wire 291 is formed on the planarization layer 30, thereby making the first anode wiring 2913 electrically connect to the first line segment 2911 and the second line segment 2912 through the electrically conductive hole 31A and the electrically conductive hole 31B to form one complete first signal conducting wire 291 as illustrated in FIG. 5. In other words, as illustrated in FIG. the first signal conducting wire 291 includes a first line segment 2911, the first anode wiring 2913, and the second line segment 2912, and the first signal conducting wire 291 extends to the second position L2 of the display region from the first position L1 of the display region and passed through the wiring changing region 101, furthermore, the first line segment 2911, the second line segment 2912 and the first anode wiring 2913 are performed wiring changing connection on the wiring changing region 101. Afterward, as illustrated in FIG. 2, the organic layer 33 is formed on the planarization layer 30 and the first anode wiring 2913.

In this embodiment, the anode layer 32 and the first anode wiring 2913 are formed simultaneously, and in another embodiment, the anode layer 32 and the first anode wiring 2913 can be formed at different times. In an embodiment, the anode layer 32 and the first anode wiring 32' are at a same horizontal height.

The anode layer 32 and the first anode wiring 2913 are formed from a laminated structure of indium tin oxide (ITO) and silver (Ag), which are different materials from that of the source electrode/drain electrode 29, the first line segment 2911, the second line segment 2912, the second signal conducting wire 292, and the third signal conducting wire 293, while the organic layer 33 is formed from a transparent organic material.

In this embodiment, signal types transmitted by the second signal conducting wire 292 and the first anode wiring 2913 of the wiring changing region 101 are same, and both are data lines. In another embodiment, the first metal conducting wire 23' and the second metal conducting wire 25' are data lines, and the second signal conducting wire 292 and the first anode wiring 2913 are scanning lines.

Figure 6:
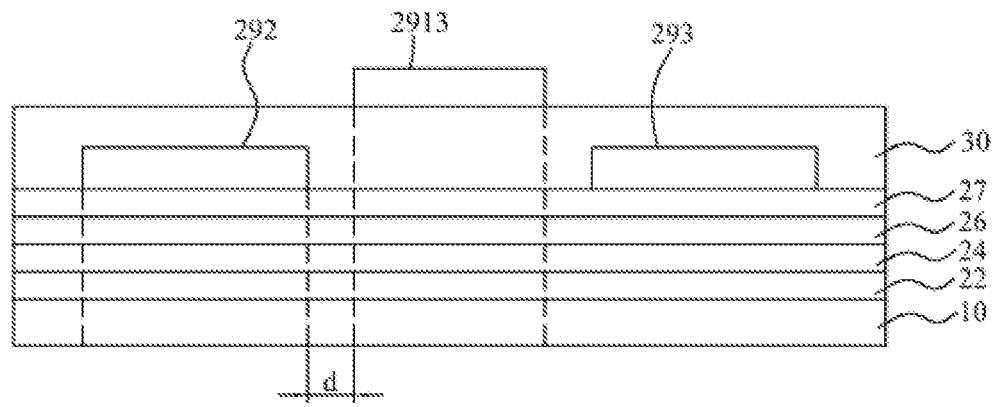
FIG. 6 is a sectional view along a sectional line A-A' in FIG. 5.

Please refer to FIG. 6, FIG. 6 is a sectional view of a sectional line A-A' in FIG. 5. Furthermore, the second signal conducting wire 292, and the third signal conducting wire 293 are disposed on the fourth insulation layer 27, while the first anode wiring 2913 of the first signal conducting wire 291 is disposed on the planarization layer 30, that is, the second signal conducting wire 292 and the third signal conducting wire 293 are located at different horizontal heights with the first anode wiring 2913 to form a wiring structure with an up-and-down staggered arrangement. Each of the second signal conducting wire 292, the third signal conducting wire 293, and the first anode wiring 2913 has a predetermined line width. In this embodiment, a line width of the second signal conducting wire 292, a line width of the third signal conducting wire 293, and a line width of the first anode wiring 2913 are less than or equal to 5 um.

As illustrated in FIG. 6, an interval between a projection of the second signal conducting wire 292 on the substrate 10 and a projection of the first anode wiring 2913 on the substrate 10 is d. In a display panel of the prior art, all data lines are located on a same layer, that is, all first signal conducting wires and first anode wirings are located at a same horizontal level. In order to prevent electromagnetic interference between each other, an appropriate interval should be kept between the first signal conducting wire and the first anode wiring, for example, the minimum interval is 2 um, so that a line-winding area of the wiring changing region is increased, thereby reducing the area of the display region. Compared to the display panel in the prior art, the second signal conducting wire 292 and the first anode wiring 2913 of the present disclosure are located on different horizontal heights. When an appropriate distance is in a vertical direction, the interval d between the two can be less than 2 um, or even the interval d can be 0, that is, the distance d can be greater than or equal to 0 um, so that the line-winding area of the wiring changing region can be reduced, thereby increasing the area of the display region, and providing a better visual sense for users.

Figure 7:
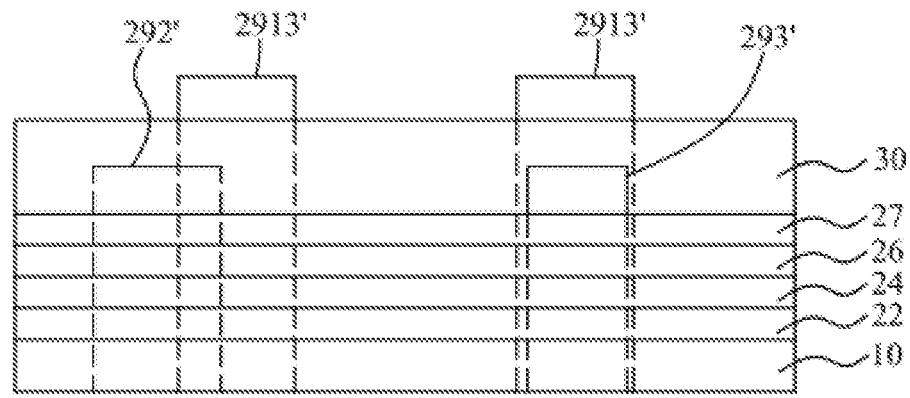
FIG. 7 is a sectional view of another embodiment of the present disclosure.

In another embodiment, as illustrated in FIG. 7, a projection of the second signal conducting wire 292' on the substrate 10 can partially overlap with a projection of the first anode wiring 2913' on the substrate 10. In another embodiment, a projection of the third signal conducting wire 293' on the substrate 10 can fully overlap with the projection of the first anode wiring 2913' on the substrate 10, so that the line-winding area of the wiring changing region can be greatly reduced.

Figure 8:
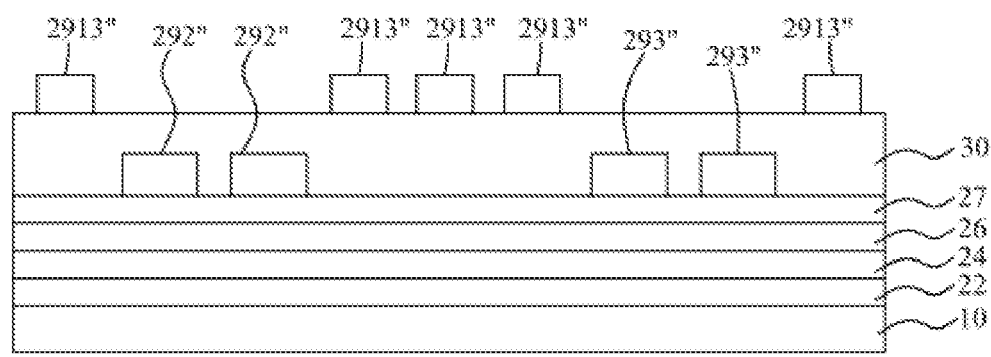
FIG. 8 is a sectional view of another embodiment of the present disclosure.

In another embodiment, as illustrated in FIG. 8, the plurality of second signal conducting wires 292" and the plurality of first anode wirings 2913" can be respectively disposed on the fourth insulation layer 27 and the planarization layer 30 according to actual requirements. Furthermore, at least two of the plurality of second signal conducting wires 292" are disposed between two adjacent first anode wirings 2913", or at least two of the plurality of first anode wirings 2913" are disposed between two adjacent second signal conducting wires 292".

The second signal conducting wire 292 and the first anode wiring 2913 of the present disclosure are located on layers of different heights to form a wiring structure with an up-and-down staggered arrangement. Compared to the method of disposing all scanning lines on a same layer in a panel of the prior art, the present disclosure greatly improves wiring density, thereby reducing the area of the wiring changing region. In addition, the anode layer 32 and the first anode wiring 2913 are formed on the planarization layer 30, so that a second signal conducting wire 292 of another layer is not needed to be formed above the second signal conducting wire 292, while the first anode wiring 2913 is changed to replace the second signal conducting wire 292 of another layer, which can reduce a manufacturing process of the second signal conducting wire 292 and the planarization layer 30, thereby reducing manufacturing material cost and manufacturing risk. Practically, the anode layer 32 and the first anode wiring 2913 are formed simultaneously, further reducing processing time, thereby reducing cost.

Figure 9:
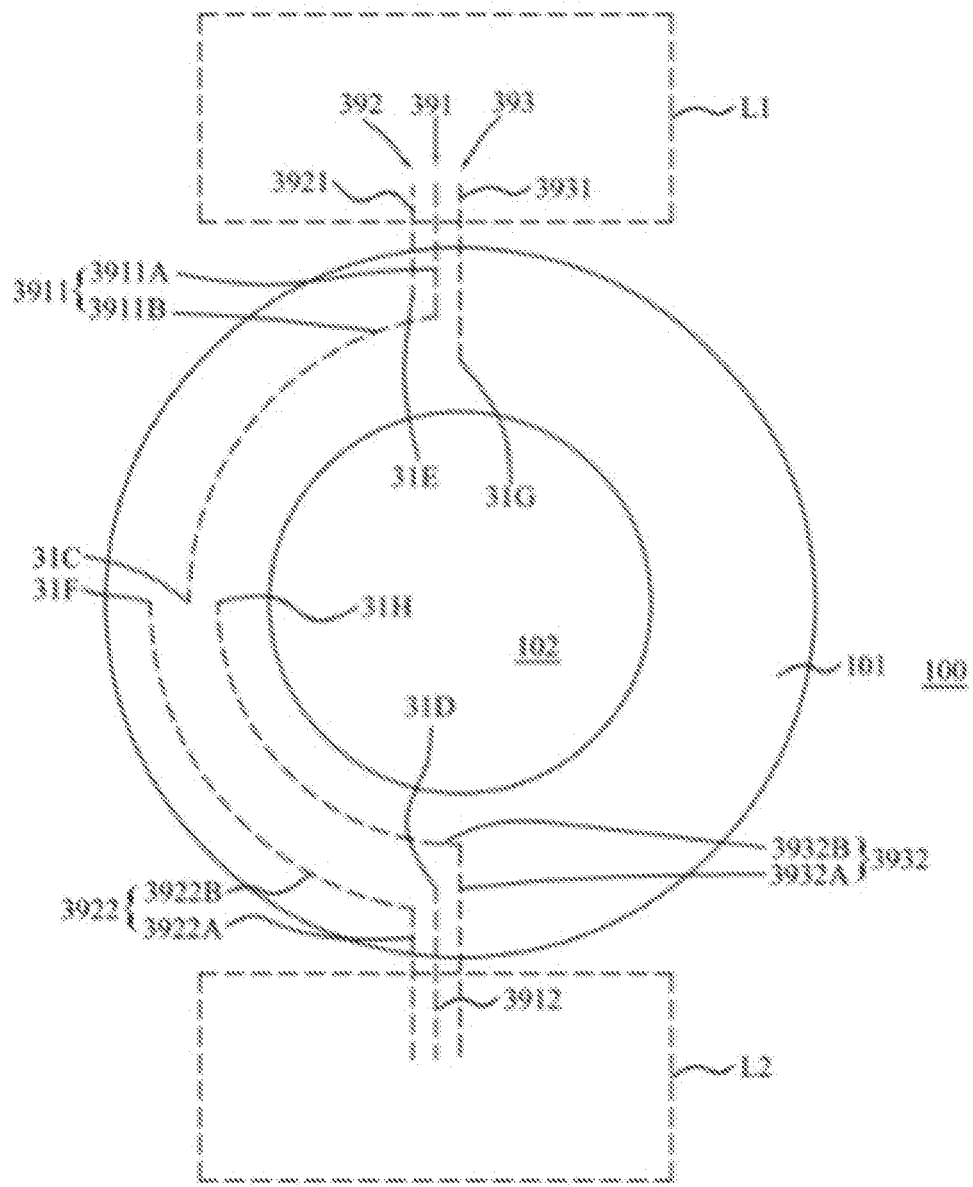
FIG. 9 is a top view after a planarization layer and electrically conductive holes being formed in a second embodiment of the present disclosure.
Figure 10:
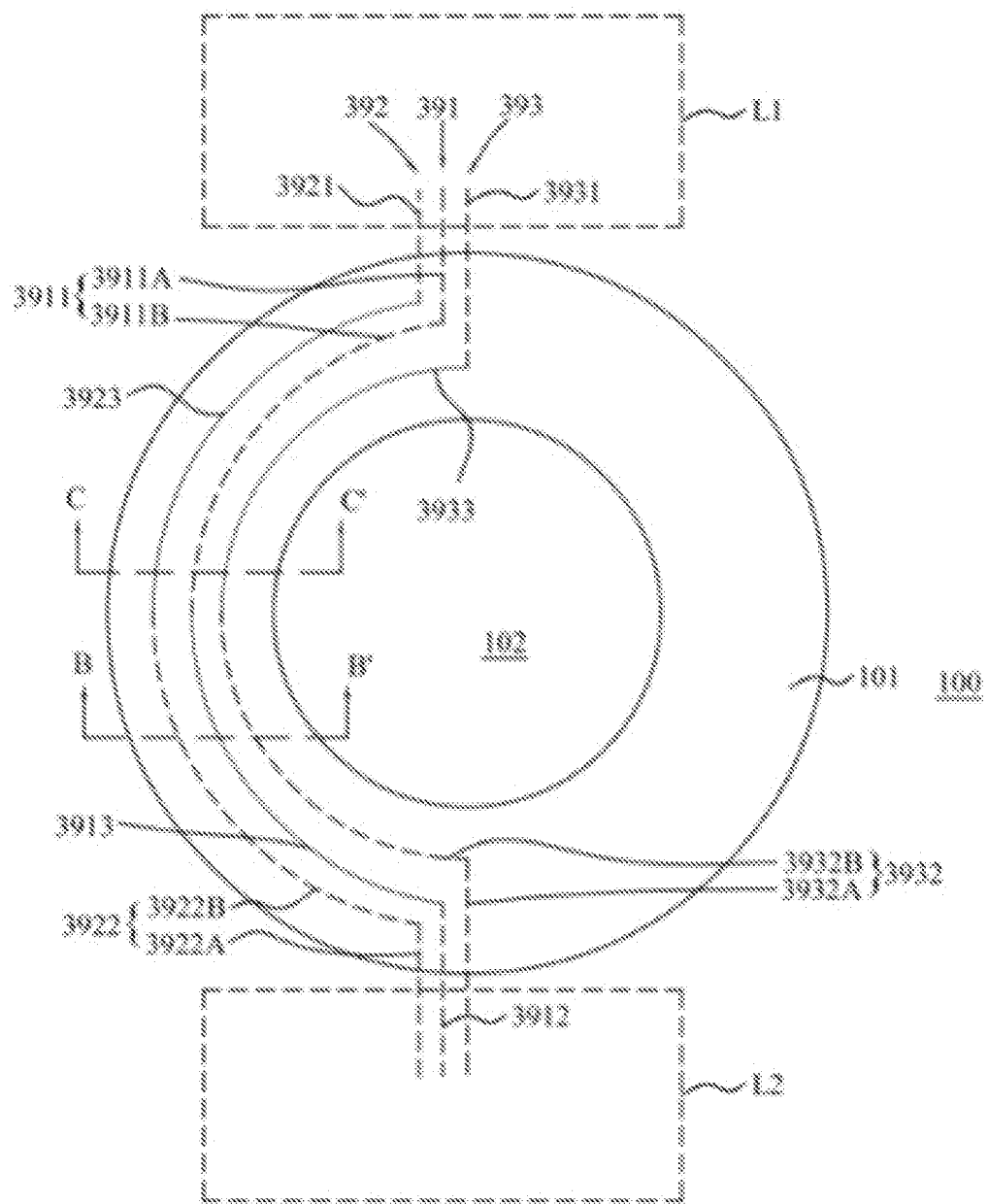
FIG. 10 is a top view after anode wirings being formed in the second embodiment of the present disclosure.
Figure 11:
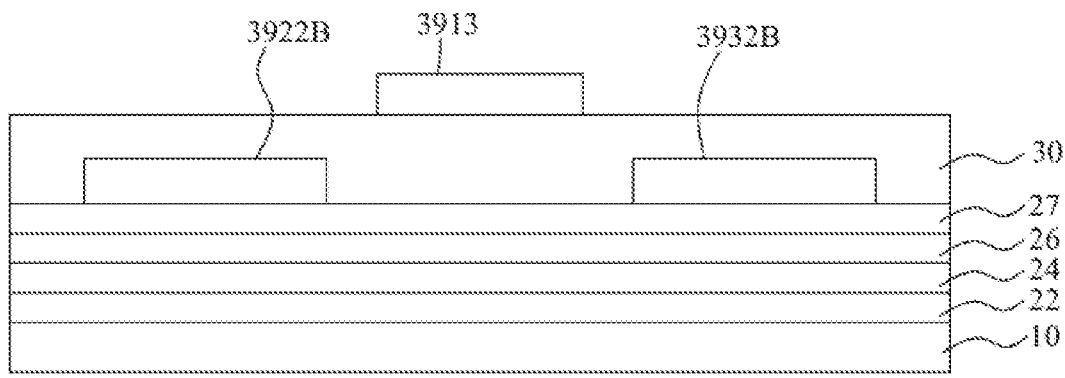
FIG. 11 is a sectional view along a sectional line B-B' in FIG. 10.
Figure 12:
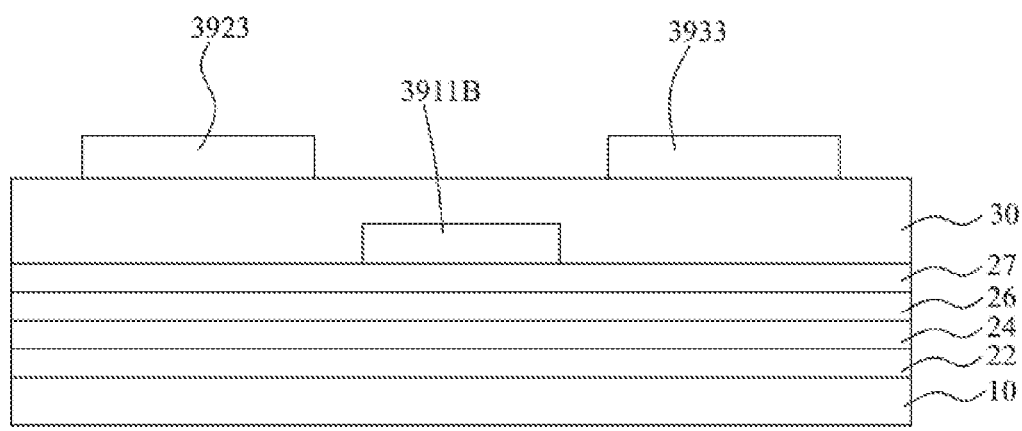
FIG. 12 is a sectional view along a sectional line C-C' in FIG. 10.

FIG. 9 to FIG. 12 are a second embodiment of the present disclosure, wherein FIG. 9 is a top view after a planarization layer and electrically conductive holes being formed, FIG. 10 is a top view after anode wirings being formed, FIG. 11 is a sectional view along a sectional line B-B' in FIG. 10, and FIG. 12 is a sectional view along a sectional line C-C' in FIG. 10. The sectional structure of this embodiment is similar to the first embodiment, therefore, please refer to FIG. 2.

As illustrate in FIG. 2 and FIG. 9, the first signal conducting wire 391, the second signal conducting wire 392, and the third signal conducting wire 393 are formed on the fourth insulation layer 27. The first signal conducting wire 391 includes a first line segment 3911 and a second line segment 3912. The first line segment 3911 extends to the wiring changing region 101 from the first position L1 of the display region 100. The second line segment 3912 extends to the second position L2 of the display region 100 from the wiring changing region 101. Furthermore, the first line segment 3911 has a first sub-line segment 3911A and a second sub-line segment 3911B. The first sub-line segment 3911A is disposed in the display region 100 and the wiring changing region 101. The second sub-line segment 3911B is disposed in the wiring changing region 101 and is connected to the first sub-line segment 3911A.

The second signal conducting wire 392 is located on a side of the first signal conducting wire 391 and includes a third line segment 3921 and a fourth line segment 3922. The third line segment 3921 extends to the wiring changing region 101 from the first position L1 of the display region 100. The fourth line segment 3922 extends to the second position L2 of the display region 100 from the wiring changing region 101. Furthermore, the fourth line segment 3922 has a third sub-line segment 3922A and a fourth sub-line segment 3922B. The third sub-line segment 3922A is disposed in the display region 100 and the wiring changing region 101. The fourth sub-line segment 3922B is disposed in the wiring changing region 101 and is connected to the third sub-line segment 3922A.

The third signal conducting wire 393 is located on another side of the first signal conducting wire 391 and includes a fifth line segment 3931 and a sixth line segment 3932. The fifth line segment 3931 extends to the wiring changing region 101 from the first position L1 of the display region 100. The sixth line segment 3932 extends to the second position L2 of the display region 100 from the wiring changing region 101. Furthermore, the sixth line segment 3932 has a fifth sub-line segment 3932A and a sixth sub-line segment 3932B. The fifth sub-line segment 3932A is disposed in the display region 100 and the wiring changing region 101. The sixth sub-line segment 3932B is disposed in the wiring changing region 101 and is connected to the fifth sub-line segment 3932A.

Next, the planarization layer 30 is formed on the first line segment 3911, the second line segment 3912, the third line segment 3921, the fourth line segment 3922, the fifth line segment 3931, the sixth line segment 3932, and the fourth insulation layer 27. Afterwards, as illustrated in FIG. 9, electrically conductive holes 31C, 31D, 31E, 31F, 31G, and 31H are respectively formed on the planarization layer 30 to expose the first line segment 3911 and the second line segment 3912.

Please refer to FIG. 10, the first anode wiring 3913 of the first signal conducting wire 391 is formed on the planarization layer 30 in the wiring changing region 101, thereby making the first anode wiring 3913 electrically connect to the second sub-line segment 3911B of the first line segment 3911 and the second line segment 3912 through the electrically conductive hole 31C and the electrically conductive hole 31D to form one complete first signal conducting wire 391. Similarly, when the first anode wiring 3913 is formed, the second anode wiring 3923 of the second signal conducting wire 392 and a third anode wiring 3933 of the third signal conducting wire 393 are simultaneously formed, thereby making the second anode wiring 3923 electrically connect to the third line segment 3921 and the fourth sub-line segment 3922B of the fourth line segment 3922 through the electrically conductive hole 31E and the electrically conductive hole 31F, and making the third anode wiring 3933 electrically connect to the fifth line segment 3931 and the sixth sub-line segment 3932B of the sixth line segment 3932 through the electrically conductive hole 31G and the electrically conductive hole 31H to form the complete second signal conducting wire 392 and third signal conducting wire 393. The position of the second sub-line segment 3911B corresponds to positions of the second anode wiring 3923 and the third anode wiring 3933. The position of the first anode wiring 3913 corresponds to positions of the fourth sub-line segment 3922B and the sixth sub-line segment 3932B.

Please refer to FIG. 11, FIG. 11 is a sectional view along a sectional line B-B' in FIG. 10. Furthermore, the fourth sub-line segment 3922B of the second signal conducting wire 392 and the sixth sub-line segment 3932B of the third signal conducting wire 393 are disposed on the fourth insulation layer 27, while the first anode wiring 3913 of the first signal conducting wire 391 is disposed on the planarization layer 30, that is, the second signal conducting wire 392 and the third signal conducting wire 393 are located at a different horizontal height with the first anode wiring 3913 to form a wiring structure with an up-and-down staggered arrangement.

Please refer to FIG. 12, FIG. 12 is a sectional view along a sectional line C-C' in FIG. 10. Furthermore, the second anode wiring 3923 of the second signal conducting wire 392 and the third anode wiring 3933 of the third signal conducting wire 393 are disposed on the planarization layer 30, while the second sub-line segment 3911B of the first signal conducting wire 391 is disposed on the fourth insulation layer 27, that is, the second signal conducting wire 392 and the third signal conducting wire 393 are located at different horizontal heights with the first anode wiring 3913 to form a wiring structure with an up-and-down staggered arrangement.

The line-winding method of the first embodiment of the present disclosure is illustrated as FIG. 5, which is using the first anode wiring 2913 of the wiring changing region 101 to replace wirings should be located on the fourth insulation layer 27 originally, and the wirings are replaced by complete wirings. Furthermore, the line-winding method of the second embodiment is partially replacement as illustrated in FIG. 10, that is, part of the wiring such as second sub-line segment 3911B is disposed on the fourth insulation layer 27, and another part of the wiring such as the first anode wiring 2913 replaces the wiring should be located on the fourth insulation layer 27 originally. Besides the replacement of one singular wiring 391, it may also be replaced by two adjacent wirings 391, 392 as illustrated in FIG. 10. This method can further reduce electrical resistance difference between adjacent wirings of a line-winding region.

Another embodiment of the present disclosure provides a structure of a display panel. As illustrated in FIG. 2 and FIG. 5, the display panel includes:
- a substrate 10 divided into the transparent region 102, the wiring changing region 101, and the display region 100, wherein the wiring changing region 101 encircles the transparent region 102, the display region 100 encircles the wiring changing region 101, and the display region 100 has a first position L1 and a second position L2;
- the active layer 21 disposed on the substrate 10;
- a plurality of insulating layers 22, 24, 26, 27 disposed on the active layer 21;
- the first signal conducting wire 291 including:
  - the first line segment 2911 disposed on the plurality of insulating layers 22, 24, 26, 27 and extending to the wiring changing region 100 from the first position L1 of the display region 100;
  - a second line segment 2912 disposed on the plurality of insulating layers 22, 24, 26, 27 and extending to the second position L2 of the display region 100 from the wiring changing region 101;
- a planarization layer 30 disposed on the first line segment 2911, the second line segment 2912, and the plurality of insulating layers 22, 24, 26, 27;
- wherein the first signal conducting wire 291 further includes a first anode wiring 2913 disposed on the planarization layer 30 and located in the wiring changing region 101, and the first anode wiring 2913 is electrically connected to the first line segment 2911 and the second line segment 2912.

In an embodiment, the display panel further includes a second signal conducting wire 292 disposed on the side of the first signal conducting wire 291, wherein the second signal conducting wire 292 is disposed on the plurality of insulating layers 22, 24, 26, 27, extends to the second position L2 of the display region 100 from the first position L1 of the display region 100, and passes through the wiring changing region 101.

In an embodiment of the present disclosure, as illustrated in FIG. 10, the display panel further includes a second signal conducting wire 392 located on a side of the first signal conducting wire 391. The second signal conducting wire 392 includes:
- a third line segment 3921 disposed on the plurality of insulating layers and extending to the wiring changing region 101 from the first position L1 of the display region 100;
- a fourth line segment 3922 disposed on the plurality of insulating layers and extending to the second position L2 of the display region 100 from the wiring changing region 101; and
- a second anode wiring 3923 disposed on the planarization layer 30 and located in the wiring changing region 101, wherein the second anode wiring 3923 is electrically connected to the third line segment 3921 and the fourth line segment 3922;
- wherein the first line segment 3911 has a first sub-line segment 3911A and a second sub-line segment 3911B, the first sub-line segment 3911A is disposed in the display region 100 and the wiring changing region 101, and the second sub-line segment 3911B is disposed in the wiring changing region 101 and is connected to the first sub-line segment 3911A and the first anode wiring 3913;
- wherein the fourth line segment 3922 has a third sub-line segment 3922A and a fourth sub-line segment 3922B, the third sub-line segment 3922A is disposed in the display region 100 and the wiring changing region 101, and the fourth sub-line segment 3922B is disposed in the wiring changing region 101 and is connected to the third sub-line segment 3922A and the second anode wiring 3923.

In summary, the present disclosure provides a display panel and a manufacturing method thereof. The anode layer located on the display region and the first anode wiring located on the wiring changing region are formed simultaneously, and changing wirings of the first line segment, the second line segment, and the first anode wiring of the first signal conducting wire are used on the wiring changing region to replace changing wirings between signal conducting wires at up-and-down two layers in the prior art, reducing manufacturing of a layer of a signal conducting wire and a layer of a planarization layer above, and can reduce a manufacturing process time, thereby reducing manufacturing cost and processing risk. In addition, the first metal conducting wire and the second metal conducting wire of the wiring changing region are located on layers with different heights to form a wiring structure with an up-and-down staggered arrangement, and the first anode wiring of the first signal conducting wire and the second signal conducting wire of the wiring changing region are located on layers with different heights to form a wiring structure with an up-and-down staggered arrangement. Compared to panels in the prior art, that is, a manner of disposing all scanning lines and data lines at a same layer respectively, the present disclosure greatly improves wiring density, thereby reducing an area of the wiring changing region, improving an area of the display region, and improving screen-to-body ratio.

The display panel and the preparation method thereof provided by the present disclosure are described in detail above. It should be understood that, the exemplary embodiments described herein should be considered in descriptive, and is used for understanding the method of the present disclosure and its main idea, and is not intended to limit the present disclosure. Descriptions of features or aspects in each exemplary embodiment should generally be considered as being applied to similar features or aspects in other exemplary embodiments. While the present disclosure has been described with reference to the preferred embodiments, various modifications and changes can be made by those skilled in the art. The present disclosure is intended to cover such varieties and modifications within the scope of the appended claims, and any modifications, equivalents, and improvements made within the spirit and scope of the present disclosure should be included in the scope of the present disclosure.

What is claimed is:

1. A display panel, comprising:
    a substrate divided into a transparent region, a wiring changing region, and a display region, wherein the wiring changing region encircles the transparent region, the display region encircles the wiring changing region, and the display region has a first position and a second position;
    an active layer disposed on the substrate;
    a plurality of insulating layers disposed on the active layer;
    a first signal conducting wire comprising:
    a first line segment disposed on the plurality of insulating layers and extending to the wiring changing region from the first position of the display region;
    a second line segment disposed on the plurality of insulating layers and extending to the second position of the display region from the wiring changing region; and
    a planarization layer disposed on the first line segment, the second line segment, and the plurality of insulating layers;
    wherein the first signal conducting wire comprises a first anode wiring disposed on the planarization layer and located in the wiring changing region, and the first anode wiring is electrically connected to the first line segment and the second line segment.

2. The display panel as claimed in claim 1, wherein a line width of the first line segment, a line width of the second line segment, and a line width of the first anode wiring are less than or equal to 5 um.

3. The display panel as claimed in claim 1, wherein the display panel comprises a second signal conducting wire disposed on a side of the first signal conducting wire, wherein the second signal conducting wire is disposed on the plurality of insulating layers, extends to the second position of the display region from the first position of the display region, and passes through the wiring changing region.

4. The display panel as claimed in claim 3, wherein the first anode wiring and the second signal conducting wire are arranged in an up-and-down staggered arrangement.

5. The display panel as claimed in claim 3, wherein the display panel comprises a plurality of the first anode wirings and a plurality of the second signal conducting wires, wherein at least two of the plurality of the second signal conducting wires are disposed between two adjacent first anode wirings.

6. The display panel as claimed in claim 3, wherein the display panel comprises a plurality of the first anode wirings and a plurality of the second signal conducting wires, wherein at least two of the plurality of the first anode wirings are disposed between two adjacent second signal conducting wires.

7. The display panel as claimed in claim 3, wherein an interval between a projection of the first signal conducting wire on the substrate and a projection of the second signal conducting wire on the substrate is greater than or equal to 0 um.

8. The display panel as claimed in claim 1, wherein the display panel comprises:
    a second signal conducting wire located on a side of the first signal conducting wire, wherein the second signal conducting wire comprises:
    a third line segment disposed on the plurality of insulating layers and extending to the wiring changing region from the first position of the display region;
    a fourth line segment disposed on the plurality of insulating layers and extending to the second position of the display region from the wiring changing region; and
    a second anode wiring disposed on the planarization layer and located in the wiring changing region, wherein the second anode wiring is electrically connected to the third line segment and the fourth line segment;
    wherein the first line segment has a first sub-line segment and a second sub-line segment, the first sub-line segment is disposed in the display region and the wiring changing region, and the second sub-line segment is disposed in the wiring changing region and is connected to the first sub-line segment and the first anode wiring; and
    wherein the fourth line segment has a third sub-line segment and a fourth sub-line segment, the third sub-line segment is disposed in the display region and the wiring changing region, and the fourth sub-line segment is disposed in the wiring changing region and is connected to the third sub-line segment and the second anode wiring.

9. The display panel as claimed in claim 8, wherein a position of the second sub-line segment corresponds to a position of the second anode wiring, and a position of the first anode wiring corresponds to a position of the fourth sub-line segment.

10. The display panel as claimed in claim 9, wherein a line width of the first line segment, a line width of the second line segment, and a line width of the first anode wiring are less than or equal to 5 um, and an interval between a projection of the first signal conducting wire on the substrate and a projection of the second signal conducting wire on the substrate is greater than or equal to 0 um.

11. A manufacturing method of a display panel, comprising following steps:
    providing a substrate, wherein the substrate is divided into a transparent region, a wiring changing region, and a display region, wherein the wiring changing region encircles the transparent region, the display region encircles the wiring changing region, and the display region have a first position and a second position;
    forming an active layer and a first insulation layer on the substrate;
    forming a plurality of metal conducting wires and a plurality of insulating layers on the first insulation layer;
    forming a first line segment and a second line segment of a first signal conducting wire on the plurality of insulating layers, wherein the first line segment extends to the wiring changing region from the first position of the display region, the second line segment extends to the second position of the display region from the wiring changing region, and forming a planarization layer on the first line segment, the second line segment, and the plurality of insulating layers; and forming a first anode wiring of the first signal conducting wire on the planarization layer and in the wiring changing region, wherein the first anode wiring is electrically connected to the first line segment and the second line segment.

12. The manufacturing method of the display panel as claimed in claim 11, wherein the substrate has a first base, a first barrier layer, a second base, a second barrier layer, and a buffer layer.

13. The manufacturing method of the display panel as claimed in claim 12, wherein the first base and the second base are formed from polyimide, and the buffer layer is formed from silicon nitride or silica based material.

14. The manufacturing method of the display panel as claimed in claim 11, wherein the transparent region has a concave section.

15. The manufacturing method as claimed in claim 11, wherein the active layer is formed from low-temperature polycrystalline-silicon, and the first insulation layer is formed from silicon nitride or silica based material.

16. The manufacturing method as claimed in claim 11, wherein forming the plurality of metal conducting wires and the plurality of insulating layers on the first insulation layer comprises:
    forming a plurality of gate electrodes, a second insulation layer, a third insulation layer, and a fourth insulation layer on the first insulation layer of the display region.

17. The manufacturing method as claimed in claim 16, wherein the plurality of gate electrodes are formed from molybdenum.

18. The manufacturing method of the display panel as claimed in claim 16, wherein forming the first line segment and the second line segment of the first signal conducting wire on the plurality of insulating layers, and forming the planarization layer on the first line segment, the second line segment, and the plurality of insulating layers comprise:
    defining a plurality of electrically conductive holes in the first insulation layer, the second insulation layer, the third insulation layer, and the fourth insulation layer of the display region, and then forming a source electrode and a drain electrode on the fourth insulation layer.

19. The manufacturing method as claimed in claim 11, wherein forming the plurality of metal conducting wires and the plurality of insulating layers on the first insulation layer comprises:
    forming a first metal conducting wire, a second insulation layer, a second metal conducting wire, a third insulation layer, and a fourth insulation layer on the first insulation layer of the wiring changing region.

20. The manufacturing method of the display panel as claimed in claim 19, wherein the first metal conducting wire and the second metal conducting wire are formed from molybdenum, and the second insulation layer, the third insulation layer, and the fourth insulation layer are formed from silicon nitride or silica based material.

* * * * *